219-121

CROSS REFERENCE SEARCH ROOM

June 18, 1968 S. J. LINS 3,388,461

PRECISION ELECTRICAL COMPONENT ADJUSTMENT METHOD

Filed Jan. 26, 1965 4 Sheets-Sheet 1

INVENTOR
STANLEY J. LINS
BY Charles A. Johnson
ATTORNEY

RESISTANCE CHANGES OF AN UNPASSIVATED RESISTOR ON A GLAZED SUBSTRATE AFTER EXPOSURE TO LASER PULSES.

PRECISION ELECTRICAL COMPONENT ADJUSTMENT METHOD

Filed Jan. 26, 1965 4 Sheets-Sheet 4

RESISTANCE CHANGES OF A SILICON MONOXIDE PASSIVATED RESISTOR ON A GLAZED SUBSTRATE AFTER EXPOSURE TO LASER PULSES.

RESISTANCE CHANGES OF A PASSIVATED RESISTOR ON AN UNGLAZED SUBSTRATE AFTER EXPOSURE TO LASER PULSES.

3,388,461

PRECISION ELECTRICAL COMPONENT ADJUSTMENT METHOD

Stanley J. Lins, Minneapolis, Minn., assignor to Sperry Rand Corporation, New York, N.Y., a corporation of Delaware Filed Jan. 26, 1965, Ser. No. 428,117
1 Claim. (Cl. 29—610)

ABSTRACT OF THE DISCLOSURE

A method for trimming or tailoring the parameter values of electrical circuit components by applying energy pulses from a laser source to the component material to thereby change its parameter value in discrete steps, monitoring the change and terminating the application of the energy pulses when a desired parameter value is reached.

*Background of invention*

This invention relates to the precision adjustment of electrical components. More particularly it relates to the precision adjustment of deposited resistor elements by selective transient annealing of the resistor material by the controlled application of a focused power pulse to a portion of the resistor element.

The formation of electrical component elements by vacuum deposition for operation in micro-circuit arrangements and for generation of integrated circuits is well-known in the art. Often the manufacture of resistor elements is performed in large batch arrays by these vacuum deposition techniques. These vacuum evaporation techniques are utilized to achieve high component density while maintaining a reliability with regard to component values. When applied to formation of resistor elements, the vacuum deposition techniques are utilized to provide resistance values which are only close to the desired end value. The array of resistors or the individual resistors are then treated in a variety of ways to bring the individual resistance values within the predetermined resistance value tolerances. An early method of such adjustment was physically abrading away a portion of the deposited material, thereby reducing the quantity of resistive material; and, thus, affecting the resistance value. The process of abrasion usually utilizes an abrasive powder which is directed against the surface of the resistor being adjusted. This is often done by impelling the particles with pressurized air. As the supply of abrasive material continues to be driven against the resistor, the residue particles are forced outward on the assembly and actually abrade elements adjacent to the element primarily being considered. Such incidental abrasion causes an undesired effect on the electrical characteristics of the adjacent elements, and limits the tolerances to which the entire assembly can ultimately be adjusted. This also gives the disadvantageous condition of residue dust formed from the abrasion and causes a problem of cleaning the resultant resistor and resistor arrays to prevent electrical circuit failure. A further disadvantage is caused when too much material is removed. Another post-deposition method of adjusting the resistance value is a steady state heating of the deposited material in a controlled manner, thereby stabilizing all resistor elements in the deposited array. This provides a static adjustment by taking advantage of the thermal aging characteristics of the resistor elements. This thermal adjustment of the resistivity is applied to all of the resistor elements in the array, and does not provide for the individual adjustment of a given component to a finer tolerance rating.

A recent development in the individual adjustment of vacuum deposited resistor elements has been described in the use of a directed concentrated laser light beam of a sufficient energy level to actually vaporize a portion of a resistor away. This operation is similar in effect to the physical abrading method mentioned above, and has a similar result of removing a physical portion of the resistor element. This process has a disadvantage of being irreversible, that is, once the resistor material is removed by vaporization it cannot thereafter be replaced. Further, vaporization cannot be controlled to the close tolerances available with the present invention, since vaporization results in a gross removal of resistive material.

It is also well known that when a thin film material has been deposited and is left in a condition exposed to the atmosphere, that an aging process causes the resistance to shift due to the electrochemical corrosion, and the oxidation that occurs on the surface of the material. A problem with the methods of adjustment described relating to removal of resistor material exists in that such methods necessarily expose the surface of the resistor element to the atmosphere. This results in the fine adjustment of the removal of material being altered by the subsequent aging process of the exposed material.

*Summary*

This invention attends itself to the problems mentioned in connection with the foregoing methods of adjusting resistance values in vacuum deposited thin film resistor elements. The relationship or the determination of the resistance of a given component is as follows:

$$R=\rho\frac{L}{A}$$

where $R$=resistance in ohms;
$\rho$=resistivity of ohm-centimeters;
$L$=the length of the resistive material in centimeters; and
$A$=the cross sectional area of the resistive material in square centimeters.

From the foregoing relationship it can be seen that the resistance of a given component can be altered by changing any one or more of three parameters, namely the length of the material, the cross-sectional area of the material, or the resistivity. The primary methods of altering resistance of a component in the prior art have been to alter the length or the cross sectional area by the techniques mentioned. This invention comprises the method of closely controlling the application of a concentrated supply of energy pulses upon a portion of an individual vacuum deposited resistor element to anneal that portion of the resistor element, thereby altering its resistivity, while monitoring the total resistance value, and continuing the application of energy pulses until the resistance value has reached a predetermined desired value. The intensity and number of such energy pulses will determine how much the resistance value is changed. The energy level here utilized is maintained substantially below the level where vaporization of the resistor material takes place, and is utilized solely as a localized transient annealing process to affect the resistivity of a portion of the resistor material. This selective adjustment process can be accomplished after the resistor elements have been allowed to age and have been preadjusted by a batch process, but before any protective coating has been put on the resistor elements. In the alternative, the adjustment can take place after a passivating coating has been placed over the resistor elements, thereby rendering them insusceptible to change from atmospheric exposure. The latter yields a distinct advantage in that once adjusted to a very fine tolerance, the passivating coating prevents further change in resistance value due to the aging of the resistor element, which would otherwise occur due to the exposure to the atmosphere. Such a stable adjustment technique is not possible in the abrasion or evaporation adjustment processes of such resistor elements.

Accordingly, a primary object of this invention is to provide an improved method for adjusting electrical component characteristics;

Another primary object of this invention is to provide an improved method for precision adjustment of individual vacuum deposited thin film resistor elements;

Another object is to provide an improved method for adjusting the resistance of individual deposited thin film resistor elements by selectively annealing a portion of the resistor elements to achieve a predetermined resistance value;

Another object of this invention is to provide an improved manufacturing method for adjusting the resistance value of individual thin film resistors within a closely spaced array of resistors by selectively annealing a portion of each resistor in the array to a predetermined value without measurably altering the resistance values of closely adjacent resistor elements;

Yet a further object of this invention is to provide a method for adjusting the resistivity of vacuum deposited thin film resistor elements to provide for either an increase or a decrease in the resistivity to provide either an increased or decreased predetermined resistance value for the resistor element;

Still a further object of this invention is to provide an improved method for precision adjustment of the resistivity of vacuum deposited thin film resistors which is not subject to further resistance value alteration due to electrochemical aging.

*Brief description of drawings*

Still other objects and advantages will become evident and will be pointed out hereinafter in the following detailed description of an illustrative embodiment of this improved process, which should be read in conjunction with the accompanying drawings, in which.

*Description of the preferred embodiments*

Figure 1:
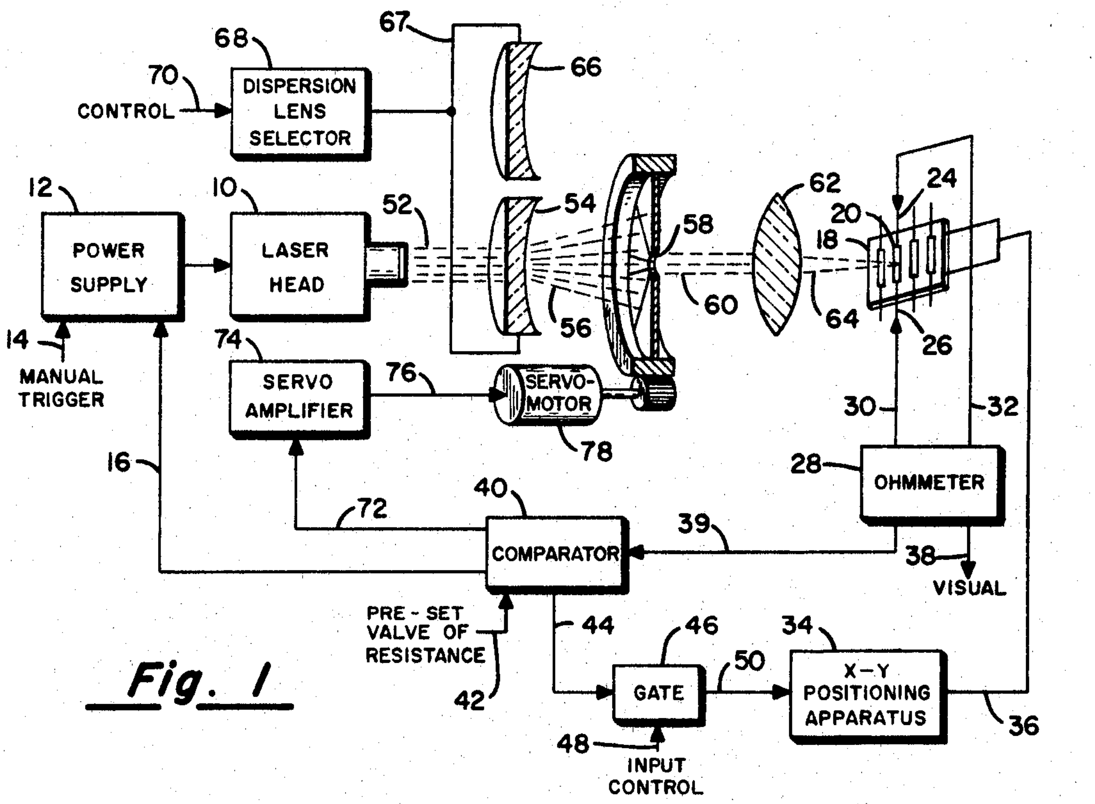
FIG. 1 is a partially schematic and partially block diagrammatic representation of apparatus which in combination can be utilized to effect the manufacturing process of precision adjustment of the resistivity of vacuum deposited thin film resistor elements.

Extensive work has been done in the investigation of materials for forming deposited resistor elements. Metal alloys have been considered but are found to have two serious disadvantages, namely, they cannot be obtained as stable films with high ohms-per-surface square values, and they tend to deposit inhomogenously because of the different vapor pressures of the constituents. Recent investigation of other materials for forming deposited resistor elements have extended to the consideration of the metallic-dielectric films. These metal-dielectric films have been given the name "cermet," an acronym for ceramic-metallic material. A characteristic cermet film that has received considerable evauation is the chromium-silicon monoxide (CrSiO) system. The chromium-silicon monoxide cermet films are deposited in a vacuum chamber of a type well-known in the art.

Cermet resistors are formed in three successive steps without breaking the vacuum. The vacuum coating chamber of the type well-known in the art is equipped with a mask changer and a multiple source which allows the cermet resistive elements, the terminal material and the silicon monoxide overcoating to be deposited in a direct sequence. The cermet is flash evaporated, after appropriate mixing of the constituent elements, onto one of two tungsten discs. With the proper mask selection, firing of this material results in the deposition of the resistive elements. The terminal material, used for making circuit interconnection is evaporated by feeding a conductive material, such as gold wire, onto a second heated tungsten disc after having changed the mask to one which defines the terminal connections to be made. Separate discs are utilized to prevent contamination of the resistive elements by the conductive terminal material. Having deposited the cermet resistive elements and the terminal connections for each resistor element, a passivation coating can be applied without breaking the vacuum. Such a passivation coating can be formed of silicon monoxide SiO. Prior to the deposition of the cermet resistor elements, the substrate is normally heated to approximately 400° C. by means well-known in the art. Additionally, the substrate member can be of any desired material suited for vapor deposition, an example of which is unglazed alumna; or, if desired, can be comprised of glazed alumna. The glazing can be provided by precoating the substrate with a surface smoothing layer such as silicon monoxide. Whether the substrate is glazed or unglazed results in a marked difference in the nature of the deposited cermet resistor elements, and will be described further below.

Resistor film thickness and deposition rate are monitored with a crystal monitor of a type well-known in the art, and resistivity is monitored by a simple resistance monitor.

The deposition masks are of an electroformed type and permit 0.007-inch wide resistors to be deposited with a high percentage of uniformity over the substrate area.

The essential steps in forming and stabilizing cermet resistors are as follows:

(1) Deposition of the cermet resistive material, e.g. chormium-silicon monoxide;

(2) Deposition of the terminal connections for each of the resistor elements, e.g. copper, gold lands;

(3) Deposition of a silicon monoxide passivating overcoat; and (4) Static stabilization of the resistors at a design value by batch heating the entire assembly in a separate operation outside of the vacuum evaporation equipment.

The pressure of the vacuum chamber during the deposition process is best suited for satisfactory operation at a pressure of $5\times10^{-5}$ to $1\times10^{-4}$ torr. The rate of deposition is approximately three Angstroms per second. The monitored stop value is determined to be near the final desired resistivity value. A static stabilizing process can be utilized subsequent to deposition, such as by controlled heating of the assembly for a predetermined time. A characteristic adjustment arrangement can be heating to approximately 300° C. for periods in excess of two hours. Finally, the transient selective adjustment is performed pursuant to the inventive process.

As described above, batch annealing is an effective means to stabilize resistive films. For some materials, primarily of the cermet variety, it can serve the secondary purpose of adjusting the resistivity. The chromium-silicon monoxide cermet exhibits a well-behaved resistivity change characteristic when heat treated. Such films can be deposited to an approximate value as described above, stabilized, and then transiently annealed to stable precise values.

It is believed that the annealing heat treatment after the deposition process can result in such phenomena as recrystallization, oxidation, stress relief, and phase changes in the material, depending upon the annealing temperature. When it is desired that structural changes do not occur, the annealing temperature must be kept below that of the deposition temperature of the substrate. Under the latter condition, when the resistors are not passivated the resistivity changes are attributable to oxidation.

The foregoing discussion relating to the chromium-silicon monoxide cermet film is intended to be illustrative of the nature of the films which can be treated in accordance with this invention, but is not intended to limit the scope of the invention to treatment thereof, and it is specifically pointed out that any material having a predictable resistivity reaction to heat treatment can be treated according to these inventive concepts.

The basis of the concept of localized transient annealing, as utilized in the subject inventive process, is the non-equilibrium temperature distribution as described by the following equation:

$$\nabla 2_T - \frac{1}{\alpha}\frac{\partial T}{\partial t} = 0$$

In a general form this is the diffusion equation. In the above form T is temperature, $\alpha$ is thermal-diffusivity, and $t$ is time. To determine the upper limit of micro-circuit packing density ameanable to such a process of localized adjustment by annealing, an approximate calculation of resolution is needed. As stated above, a problem in the prior art of attempts to adjust individual deposited resistors by applying heat which was not closely focused resulted in the adjacent resistor elements being affected in their total amount of resistance due to the flow of heat through the supporting substrate material. By closely limiting the duration of the applied energy pulse; and, further, by closely controlling the area of focus of the application of such pulse as is done in this inventive process, the foregoing problem is virtually eliminated, and adjustment can be accomplished in increments approaching 0.001%. For the types of pulses utilized, a substrate material of several thousandths of an inch in thickness is sufficient to appear approximately as a semi-infinite plane with regard to heat diffusion. It has been determined that as annealing temperature approaches the deposition temperature that a threshold value is reached. When the threshold value is exceeded resistivity changes rapidly. At temperatures substantially below deposition temperature, the resistivity exhibits characteristic of good stability. Referring to a worse case condition in a solution of Equation 1, to determine the problem of heat flow at a point on the substrate adjacent to the radiated area, it has been determined that beyond 0.005 inch from the radiated area that no measurable resistivity changes take place in adjacent deposited resistor elements.

The concept of localized transient annealing by inducing thermotransient conditions gives rise to the necessity of having a closely controllable source of energy. Such a source of energy is available from the output of the so-called laser apparatus. "Laser" is an acronyn for light amplification by stimulated emission of radiation, and is also referred to as an optical maser since it is the extension of electromagnetic techniques into the infra-red and visible light portions of the frequencies spectrum. While the laser is said to be a source of coherent waves of light, this is not strictly accurate due to imperfections in the laser unit. Instead, the light waves can be considered to be substantially coherent.

The characteristic of coherent light, or light that has a substantial coherence, is that it can be focused to achieve exceedingly high concentrations of energy because the limitations usually associated with ordinary light do not apply. When incoherent light is focused by an optical system, only a fraction of the radiation from the source can be concentrated into the image because of the geometrical limitations expressed in Abbe's sine law. This is the reason that the temperature of the image cannot be made greater than the temperature of the source in violation of the second law of thermo-dynamics: when the temperatures are equal, no more energy can be transferred from the source to the image. With a laser, focusing is limited by defraction effects alone and Abbe's sine law and the second law thermo-dynamics do not apply and the temperature in the image can be made as high as the defraction-limited focusing allows.

A laser apparatus which is available commercially is a chromium doped ruby laser, pumped by a flash lamp. The flash lamp excites the chromium ions in the commercially generated ruby to a higher energy level. Ordinarily, as the ions start to emit, the light travels back and forth between end mirrors in a resonant cavity. As the light travels back and forth, it stimulates the ruby to further emission and produces a red beam of light, which exhibits a characteristic of substantial coherence.

FIG. 1 is a partially schematic and partially diagrammatic representation of one combination of apparatus which can be utilized in effecting the improved manufacturing process of precision adjustment of the resistivity of vacuum deposited thin-film resistor elements. The laser head 10 includes an optical system which is comprised of a linear flash-lamp in a silver eliptical cavity for energizing the laser rod. The laser rod is comprised of $Al_2O_3$ which is .05% chromium doped and is provided with flat ends. Cooling systems of either water or liquid nitrogen for the ruby rod are required for high repetition rate use. With cooling, the rod can be pulsed once per second and have an output of approximately one joule. Operated with single-shot operation, the laser is capable of two to four joules output, and with liquid nitrogen cooling the output energy can be raised four to eight joules. Model 3–542 provided by the Maser Optics, Inc., is a commercially available unit which meets these requirements. To drive the laser head 10 a power supply 12 is provided. The storage capacitance of the power supply is 400 microfarads which can be charged to 2,000 volts, and can have a recycling operation to 600 joules of once per second. The power supply is equipped to provide manual triggering 14, and to allow automatic triggering via input line 16. A power supply meeting these requirements is available commercially in the Model 801 available from the Maser Optics, Inc. Limitations to the use of these units is in no way intended and other available power sources could equally as well be used.

A substrate 18 which may support a plurality of resistor elements, such as element 20, is shown in position for adjustment. Resistor element 20 is shown with leads 24 and 26 extending therefrom. Ohmmeter 28, of a type well-known in the art is provided with a pair of leads 30 and 32 coupled respectively to leads 26 and 24, for monitoring the resistance value of the element under test. The substrate 18 can be held in a jig and manually positioned for each resistor element, or it can be held in an X–Y positioning apparatus 34 which provides automated control of the positioning of each resistor element. Line 36 represents the positioning control lines for the X–Y positioning apparatus. The ohmmeter 28 provides an output on line 38 which can be viewed visually for manual operation, or can be applied as a signal on line 39 to comparator 40, of a type well-known in the art. As a part of the set-up procedure, when automatic sequencing is utilized, a predetermined value for resistance is applied in signal form to the comparator 40 via line 42. The comparator 40 then provides for the comparison operation of the ohmmeter signal applied on line 39 to the preset value applied on line 42. When the values reach a predetermined match condition, an output signal is applied to line 44 which is fed to gate 46. When the X–Y positioning apparatus 34 is to be utilized, it may be driven by a paper tape, magnetic tape, punched card, or other similar means (not shown) of input via input control line 48, which in turn is applied to gate 46. When the comparator issues the signal on line 44 which indicates that a resistor element has been adjusted to its predetermined value, gate 46 is enabled and the input control signals available from line 48 are applied via line 50 to the X–Y positioning apparatus 34 to control the selection of the next resistor element on substrate 18 which is to be adjusted.

When the laser head 10 is pulsed, a burst of light which has a substantial coherence, shown graphically as rays 52 is applied to an optical dispersion lens 54. The dispersion lens causes the rays to be dispersed, as shown by rays 56, and causes them to be directed through a variable aperture 58. The dispersion lens, or negative lens, serving as the energy spreader is arranged to match the upper limit of energy requirement for the trimming action. The variable sized aperture 58 allows a portion of the light energy 60 to be applied to a focusing lens 62, which in turn focuses the beam of energy 64 at a predetermined portion of the resistor element 20.

When a wide range of resistor values are to be adjusted, it may be necessary to provide a plurality of dispersion lenses of differing degrees of energy spreading characteristics. A second dispersion lens 66 is shown and can be arranged physically such as in a turret arrangement 67 whereby a dispersion lens selector 68 can position the desired one of the dispersion lenses in the path 52 of the laser head output. The dispersion lens selector 68 can be controlled manually or automatically and is subject to an input control via line 70, the actual control means not shown.

In the automatic system for adjusting, one output of comparator 40 is applied via line 72 to a servo amplifier 74 of a type well-known in the art. The servo amplifier is utilized to provide a control voltage on line 76 which is applied to servo motor 78. The servo motor 78 is utilized to adjust the aperture 58 for controlling the amount of energy allowed to pass therethrough, thereby controlling the amount of energy applied to the resistor element being adjusted. As the ohmmeter 28 indicates that the resistance value is approaching the preset value, the signal applied on line 72 causes the servo motor 78 to drive the aperture 58 smaller and smaller until such time as equality is indicated by the comparator 40. At the time such comparison is indicated, aperture 58 will have been completely closed. A third output from comparator 40 is enable line 16 which is utilized to pulse the power supply 12. Pulses are issued on line 16 repetitively until such time as the comparator 40 indicates that the value provided by the ohmmeter 28 and the preset value applied on line 42 are equal. When such a comparsion is generated, no further trigger pulses are provided on line 16, thereby prohibiting further automatic pulsing of the laser head 10 by power supply 12.

Figure 2:
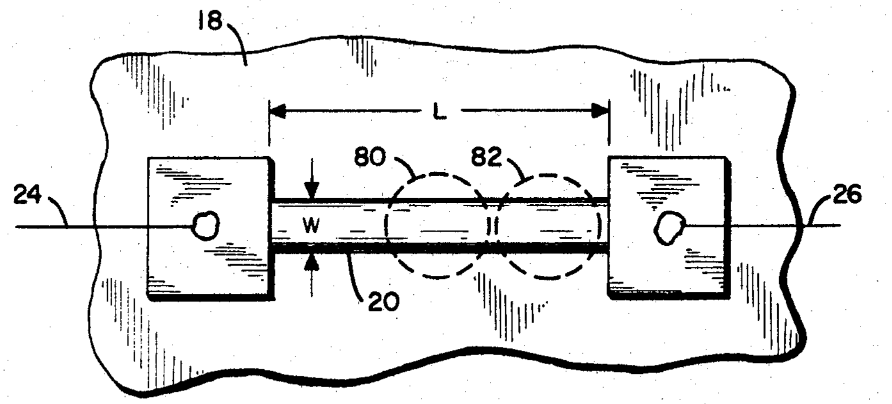
FIG. 2 is a schematic top view of a characteristic deposited resistor element which is to be adjusted.

FIG. 2 is an enlarged diagrammatic plan view of one of the resistor elements. Numerals similar to that employed in consideration of FIG. 1 are carried over to this figure. The broken away portion of the substrate 18 supports resistor element 20. The resistor element is provided with terminal leads 24 and 26. A characteristic value for length L of the resistor 35 mils and a characteristic width W is 7 mils. The focusing of the laser beam initially is on a relatively small portion of resistor 20, such as shown enclosed in dashed area 80. Due to the concentration of the laser energy pulse on this area, it is primarily the area enclosed in area 80 which is initially affected by the adjusting process. What is meant by this is that the resistivity of the area enclosed in area 80 is substantially affected during the adjustment process while the areas outside of the block are left substantially unchanged. It will be described in more detail below that the adjustment processes described herein allow both an upward and downward adjustment of resistance value. This provides an additional feature that allows a reversible adjustment. For example, assuming that it is desired to adjust a resistor to a value of 1,000 ohms, and that the resistivity is affected to a point where the resistance value is made to be 1,100 ohms. Under these circumstances, in the prior art the resistor would be valueless. When this inventive method is utilized, the resistance value can usually be brought back into alignment by applying the laser beam to a different portion of the resistor element 20, such as shown in dashed area 82. Then by controlling the adjustment to a point where the resistance value is being decreased, the value of the resistance can be brought back to the desired level. These features will be described in more detail below.

Figure 3A:
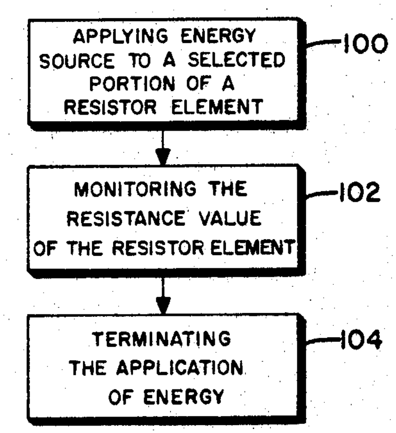
FIG. 3*a* and 3*b* are process flow diagrams.

FIG. 3*a* is a process flow diagram which describes the broad process concepts of the subject invention. The broad concepts of the adjustment method comprise the steps of:

(1) Applying a pulsed energy source to a selected portion of a resistor element, as shown by block 100, for creating a transient annealing condition in the resistor;

(2) Monitoring the resistance value of the resistor element being adjusted, as shown by block 102; and (3) terminating the application of the energy source, as indicated by block 104, when the resistance value is found to agree to a predetermined value of resistance.

Figure 3B:
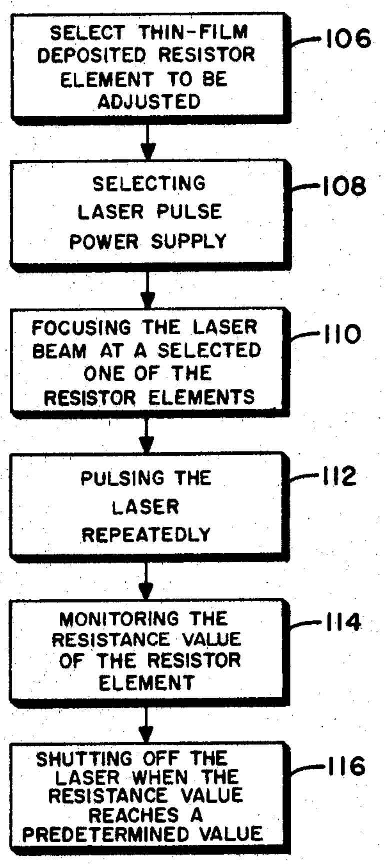

FIG. 3*b* illustrates the process steps in more detail for the subject invention, and includes the following:

(1) Selecting a thin film deposited resistor element to be adjusted, as indicated in block 106;

(2) Selecting a laser beam pulse power level, as indicated by block 108, which is below the vaporization level of the thin film deposited material;

(3) Focusing the laser beam at a selected one of the resistor elements, as indicated by block 110;

(4) Pulsing the laser repeatedly, as indicated by block 112;

(5) Monitoring the resistance value of the resistor element being adjusted, as indicated by block 114, until the resistance value reaches a predetermined level; and (6) Shutting off the laser power supply when the resistance value reaches the predetermined value as indicated by block 116. Various combinations of these and other more detailed steps may be included in the foregoing described process to achieve the various scopes and aspects of this invention.

Figure 4:
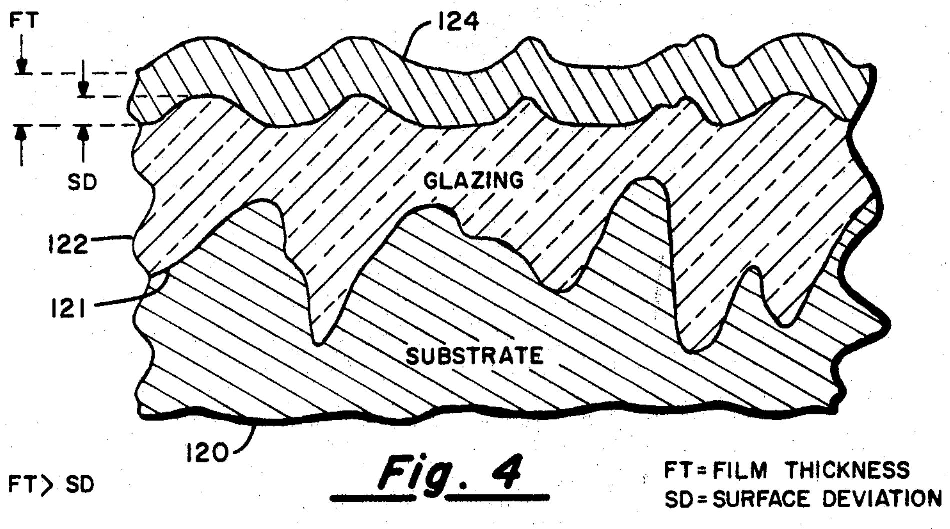
FIG. 4 is a diagrammatic cross-sectional representation of a portion of a substrate having a glazed surface with a portion of a thin film resistor element deposited thereon.
Figure 5:
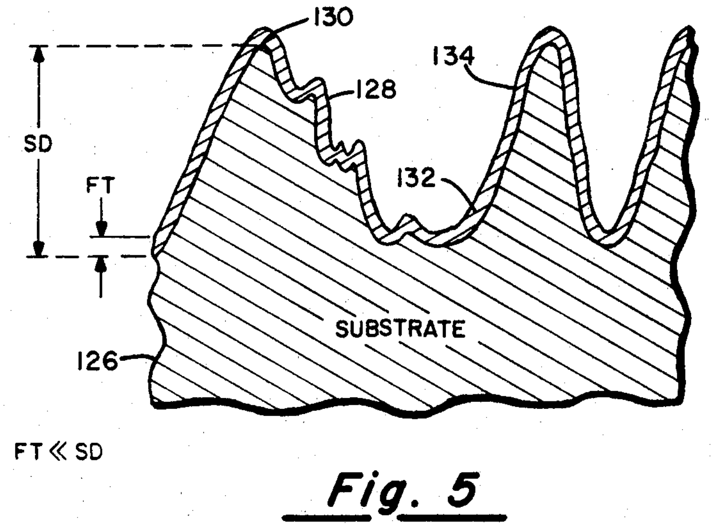
FIG. 5 is a diagrammatic cross-sectional representation of a non-glazed substrate with a thin film element deposited thereon.

FIG. 4 is a much enlarged cross sectional view of the substrate and a deposited film element. And FIG. 5 is a much enlarged cross sectional view of a substrate having a thin film element deposited thereon where the substrate has not been glazed prior to the deposition of the film. Neither FIG. 4 or 5 is to scale, and are illustrative only. The purpose of these two figures is to illustrate the difference in surface deviation between the glazed and the unglazed surface. It must be understood that this is a much expanded scale and that the actual film thickness is in a measurement unit of Angstroms. In FIG. 4 it can be seen that substrate member 120 as a very irregular surface 121 and that when a glazing material 122, such as silicon monoxide is coated thereon, that the surface deviation SD is greatly reduced. When the film element 124 is subsequently deposited on the glazed surface, it can be seen that the film thickness FT is substantially greater than the maximum surface deviation. This provides for a more uniform thickness film element than will be the case for the unglazed substrate, and results in adjustment characteristics which differ from that of the unglazed substrate, and will be defined in more detail below. Turning now to a consideration of FIG. 5 it can be seen that the substrate element 126 is not glazed and that the surface deviations SD are several orders of magnitude larger than the film thickness FT of film 128. It will be noted also that at the peaks and valleys such as points 130 and 132 the thickness of the film is appreciably greater than on the relatively steep sides of the deviation such as at point 134. This follows from the manner in which the vapor is applied in the deposition process, and appreciably alters the characteristic of the film during the adjustment procedure.

Figure 6A:
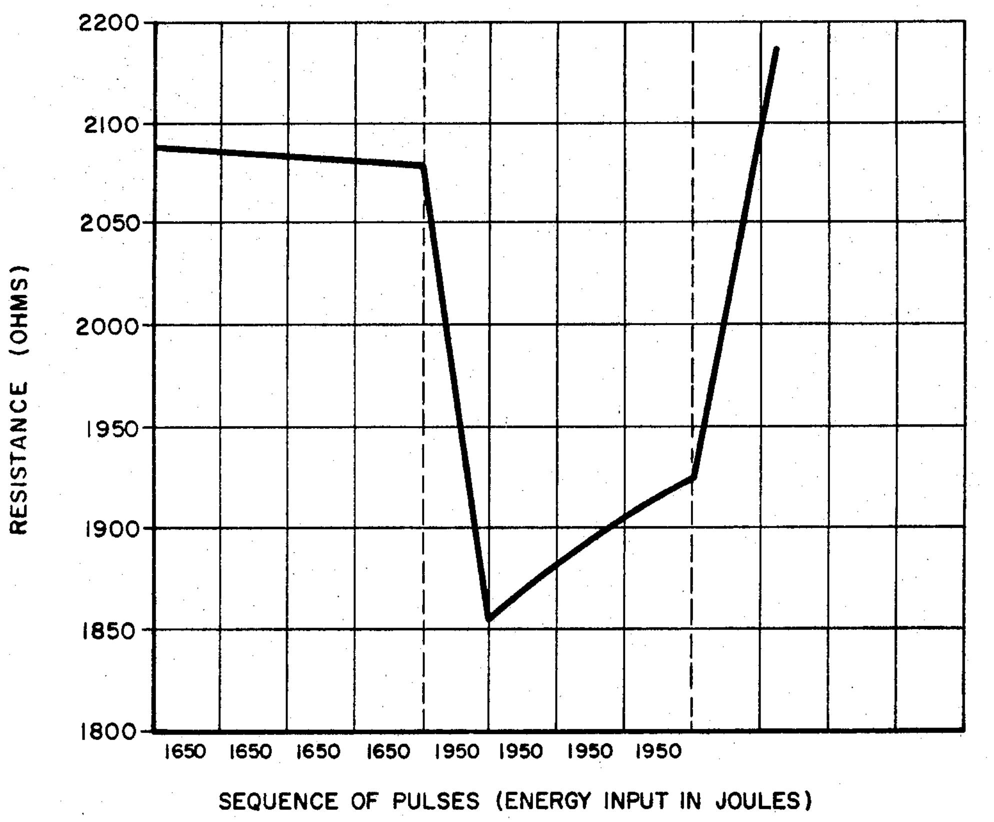
FIG. 6*a*–6*c* are graphical representations of characteristic changes in resistance values of thin film deposited resistive elements as the resistivity is altered due to the localized transient annealing of a portion thereof by the application of pulsed localized laser energy pulses.
Figure 6B:
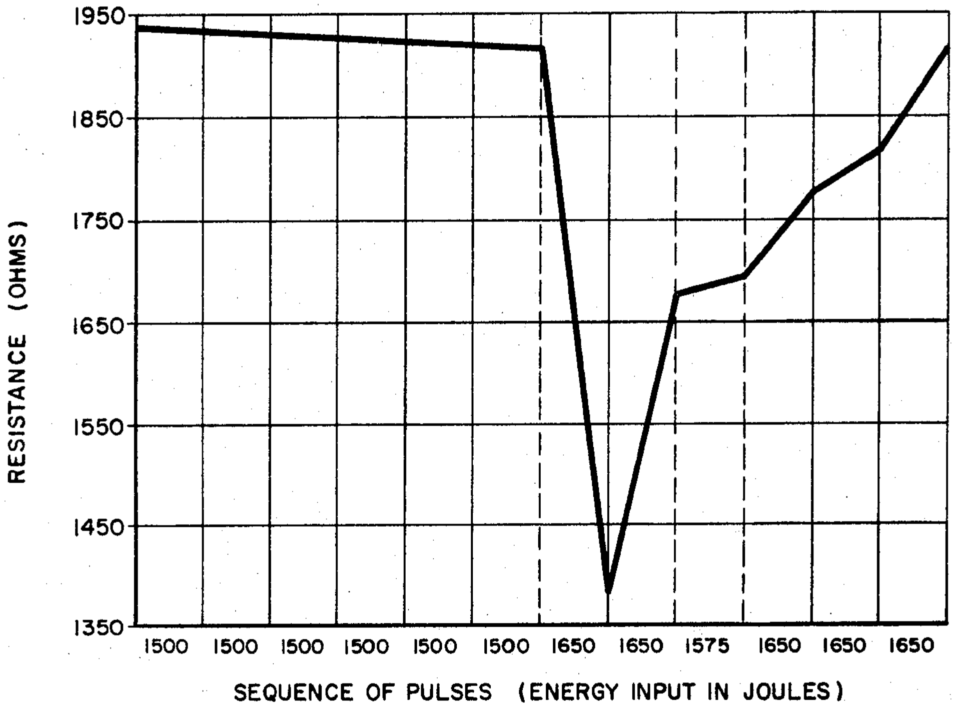
Figure 6C:
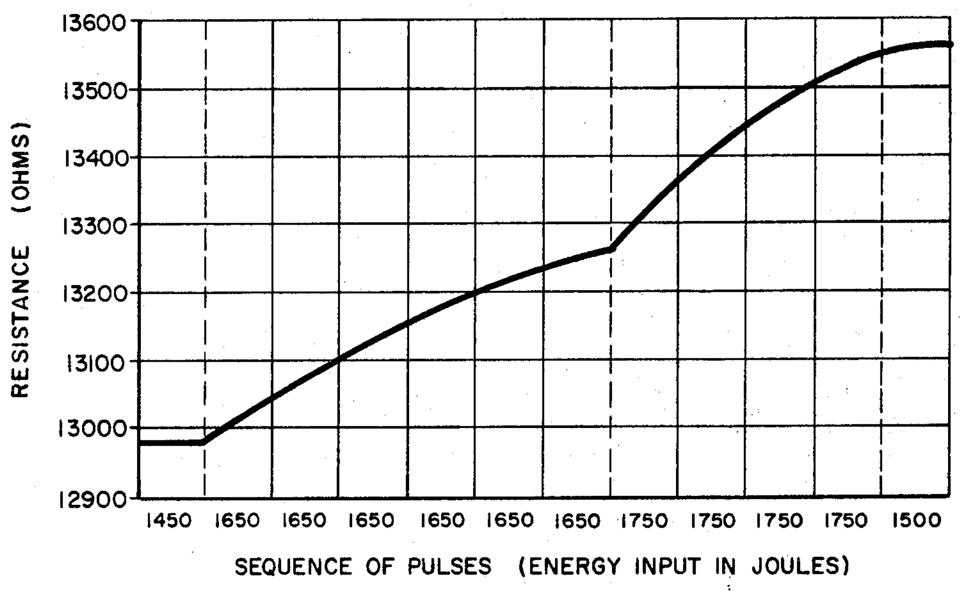

Turning now to a consideration of the graphs shown in FIG. 6*a*, FIG. 6*b* and FIG. 6*c* it will be pointed out that in each of these graphs the dotted vertical line indicates a change in power input level which results in an effective change of scale for the respective graphs.

FIG. 6*a* is a graph of the response of a resistor element which is unpassivated, that is it does not have a coating such as SiO thereon, and is deposited on a glazed substrate, as described above. It will be noted, that the resistance value decreased uniformly to the point of energy change where it decreases sharply to a minimum value. Further application of energy in the form of the pulsed laser focused light results in an increase in resistive value from that point to the second point of energy level change. At this point the increased pulse energy level causes a marked increase in the resistance value which continues beyond the originally tested resistance value. From this it can be seen that the resistor element can be adjusted first in a negative direction, that is reducing the resistance value, to a resistance level substantially lower than the value at the completion of the deposition process. At that point further adjustment can be made in the positive direction and can continue until a resistance value exceeding the originally deposited resistance value is achieved.

Recalling the discussion relating to FIG. 2, it can be seen that resistor elements exhibiting this characteristic of being able to adjust to lower values and then reverse toward increased resistance, can be recovered where the original resistance adjustment is to a value greater than desired. By focusing on a part of the resistor not previously adjusted, the overall value can be brought down by adjusting in the negative going region for the film.

FIG. 6*b* illustrates the resistance change in response to the applied laser pulses to a passivated resistor element on a glazed substrate as described above. In a manner similar to that described in relation to FIG. 6*a* it can be seen that the resistance value decreases to a point where the energy level is increased. At this point the resistance value is markedly decreased to a minimum value. At this minimum resistance point further increases of the power pulse level causes an increase in the resistance value. It will be noted that at each energy level change the rate of resistance change can be closely controlled.

Finally, turning to a consideration of FIG. 6*c* where the pulsed laser beam is applied to a passivated resistor which has been deposited on an unglazed substrate. It will be noted that the resistance value does not exhibit the initial decrease in resistance value. Instead, the resistance value rises immediately from the originally deposited resistance value. Its rate of rise, as previously described is controlled by the energy level of each of the applied pulses. Again it can be seen that the energy level of the pulse can be varied to affect the rate of resistance change per pulse. At the upper end of the graph it can be seen that as the energy pulse level is decreased the rate of resistance change is decreased.

The noted differences in adjustment characteristics of the resistors deposited on the glazed substrate and the resistors deposited on the unglazed substrate appears to be due to the differences in structure of the respective deposited elements, as described with relation to FIGS. 4 and 5.

It is understood that suitable modifications may be made in the method as disclosed provided such modifications come within the spirit and scope of the appended claim. Having now, therefore, fully illustrated and described the invention, what is claimed to be new and desired to be protected by Letters Patent is defined in the appended claim.

What is claimed is:

1. In a system for adjusting to a close tolerance the predetermined resistance value of each resistor in a closely spaced component array without measurably affecting the characteristics of closely adjacent components wherein the resistors are comprised of passivated vacuum deposited metal-dielectric composition thin-film elements, by transient pulsed annealing, the method comprising the steps of:

(a) selecting a power pulse source having a predetermined pulse power level and duration insufficient to vaporize the resistor element or any part thereof, said power pulses being provided by a selectively actuatable laser in the form of a pulsed beam of light exhibiting the characteristic of substantial coherence and directed along a predetermined path, the power level and duration being insufficient to affect the parameters of other elements in a close proximity to said resistor but outside said predetermined path;

(b) positioning a resistor to be adjusted in approximate path of the pulse laser light beam;

(c) directing the laser light beam through a dispersion lens toward a variable sized aperture;

(d) focusing the portion of the laser light beam allowed to pass through the variable sized aperture at a predetermined portion of the resistor being adjusted;

(e) periodically actuating the laser for providing pulsed heating of the resistor element for adjusting the resistivity of the resistor due to transient annealing of at least a portion thereof;

(f) monitoring the resistance value of the resistor being adjusted after the application of each pulsed light beam and providing a manifestation indicative of the monitored value;

(g) providing a difference manifestation, if any, indicative of the difference between the monitored resistance value and the determined desired value;

(h) reducing the size of the variable sized aperture after repetitive applications of the power pulse for reducing the amount of energy to be applied to the resistor on subsequent applications of the pulsed light beam; and (i) interrupting the periodic actuation of the laser, thereby terminating the transient annealing, when the difference manifestation indicates that the monitored resistance value is substantially equal to the predetermined desired resistance value.

References Cited

UNITED STATES PATENTS

| | | | |
|---|---|---|---|
| 3,261,082 | 7/1966 | Maissel et al. | 29—155.62 X |
| 3,244,412 | 4/1966 | Robinson et al. | 330—4.3 |
| 3,177,134 | 4/1965 | Gartner et al. | 117—217 X |
| 2,808,351 | 10/1957 | Colbert et al. | 117—217 X |

JOHN F. CAMPBELL, *Primary Examiner.*

CHARLIE T. MOON, WILLIAM I. BROOKS, *Examiners.*

J. L. CLINE, *Assistant Examiner.*

UNITED STATES PATENT OFFICE

CERTIFICATE OF CORRECTION

Patent No. 3,388,461 June 18, 1968

Stanley J. Lins

It is certified that error appears in the above identified patent and that said Letters Patent are hereby corrected as shown below:

Column 10, line 41, "determined" should read -- predetermined --.

Signed and sealed this 25th day of November 1969.

(SEAL)
Attest:

Edward M. Fletcher, Jr.
Attesting Officer

WILLIAM E. SCHUYLER, JR.
Commissioner of Patents